United States Patent [19]

Andrews

[11] 3,986,919

[45] Oct. 19, 1976

[54] SPLICE STATION FOR A HEAT SEAL FILM SPLICER

[75] Inventor: Peter Andrews, Penfield, N.Y.

[73] Assignee: Eastman Kodak Company, Rochester, N.Y.

[22] Filed: May 12, 1975

[21] Appl. No.: 576,946

[52] U.S. Cl. .............................. 156/502; 156/157; 156/304; 156/506

[51] Int. Cl.² .................... B31F 5/00; G03D 15/04; G03F 1/00

[58] Field of Search .......... 156/157, 159, 306, 502, 156/505, 506, 510, 516, 530, 304, 545

[56] References Cited

UNITED STATES PATENTS 3,725,168 4/1973 Rosborough et al. ............... 156/157

3,767,512 10/1973 Tsuda ............................... 156/502

*Primary Examiner*—William A. Powell
*Assistant Examiner*—John E. Kittle
*Attorney, Agent, or Firm*—T. H. Close

[57] ABSTRACT

A heat seal film splicer having a reciprocating heated splice head movable along a guide track between a first position wherein the splice head is adapted to co-operate with the guide track to cut off a length of heat activated splice tape and to apply heat and pressure to a splice and a second position away from the first position is provided with a means for thermally decoupling the splice head from the guide track when the splice head is in its second position.

4 Claims, 6 Drawing Figures

SPLICE STATION FOR A HEAT SEAL FILM SPLICER

BACKGROUND OF THE INVENTION

1. Field of the Invention

This invention relates to heat seal splicers for splicing film strips and in particular to an improvement in the splicing station for such splicers.

2. Description of the Prior Art.

Heat seal splicers for splicing film strips are well known in the art, one example being the splicer shown in U.S. Pat. No. 3,725,168. In such splicers, a length of heat activated splice tape is applied under heat and pressure to the ends of film to be spliced. The splice station includes a splice pad for supporting the ends of film to be spliced, a heated splice head for applying the splice tape under heat and pressure to the film ends, and a guide track for supporting and guiding the splice head. The heated splice head is moved along the guide track to the splice pad by means such as a pneumatic or hydraulic cylinder.

A slot is provided in the guide track, near the splice pad, through which lengths of the splice tape are advanced from a continuous supply. As the splice head is moved towards the splice pad, a portion of the splice head cooperates with the guide track to sever the length of splice tape from the supply. As the splice head continues its movement toward the splice pad, the heat activated splice tape is applied to the ends of the film to effect the splice. In order to effectively sever the splice tape and to insure proper alignment of the heated splice head with the splice pad, the splice head is continuously urged into contact with the guide track by means such as springs connected between the splice head and the guide track. Although it is desirable to have the splice head in tight contact with the guide track when the splice tape is being severed and when the splice is being made, contact with the guide track at other times results in undesirable heat sinking from the splice head into the guide track. Due to this heat sinking, the heating element in the splice head expends energy which is wasted in heating up the guide track. If the guide track becomes too hot, the slot through which the splice tape passes may prematurely activate the adhesive on the tape, resulting in the build-up of a gummy residue at the slot and eventual fouling of the splice tape advance.

This heat sinking phenomenon also results in a longer warm-up time when the splicer is first turned on since some of the energy used to heat up the splice head is dissipated into the guide track.

It was recognized by the inventor that the elimination of this heat sinking would permit the use of a lower power heating element in the splice head, would result in faster machine warm-up times, and would eliminate the problem of an accumulation of the heat activated adhesive on the splice tape slot in the guide track.

SUMMARY OF THE INVENTION

Accordingly, the present invention comprises an improved spliced station for a heat seal film splicer wherein a means is provided for urging the splice head into firm contact with the guide track in response to movement of the splice head towards the splice pad and for releasing the splice head from firm contact with the guide track in response to movement of the splice head away from the splice pad, thereby substantially thermally decoupling the splice head from the guide track when an actual splicing operation is not being performed.

In the preferred embodiment of the invention, the splice head is provided with a roller and lever arrangement which cooperates with a cam surface on the guide track to urge the splice head into contact with the guide track as the splice head is moved towards the splice pad and to release the splice head as it is moved away from the splice pad.

In an alternative embodiment of the invention, a spring coupled to the splice head and the guide track continuously urges the splice head toward firm contact with the guide track. A parallelogram arrangement disposed between the guide track and the splice head is adapted to engage the splice head in response to movement of the splice head away from the splice pad and to force the splice head away from the guide track.

DESCRIPTION OF THE PREFERRED EMBODIMENTS

The following description is directed to an improvement in heat seal splicers such as the splicer described in U.S. Pat. No. 3,725,168. Briefly, such apparatus includes a film track for receiving lengths of film to be spliced, a splice station where a length of heat activated splice tape is applied to the leading and trailing ends of lenghts of film to be spliced and a take-up for receiving the spliced lengths of film. This invention relates only to the splice station, the other elements of the splicer being well known in the art will not be discussed here.

Figure 1:
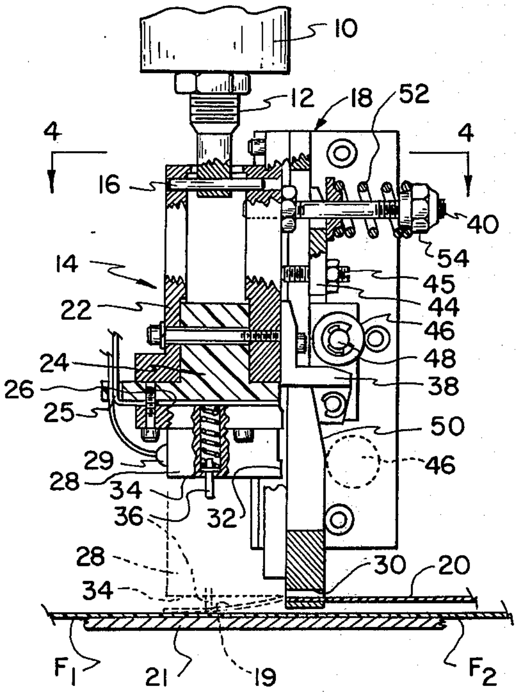
FIG. 1 is a side view, partially broken away, of the splice station according to the preferred embodiment of the invention.

The splice station (see FIG. 1) includes a splice head 14 that is adapted to apply a segment of heat activated splice tape 20 to the ends of film lengths $F_1$ and $F_2$ arranged beneath the splice head on a splice pad 21. The splice head is slidable vertically along a guide track 18 which is secured to the frame of the splicer. A pneumatic or hydraulic actuator 10 is likewise mounted to the body of the splicer, and a movable piston portion 12 of the actuator 10 is loosely connected to the splice head 14 by means of pin 16. The splice head is movable up and down along the guide track by means of the actuator 10.

The splice head 14 includes a splice tape applier block 28, constructed from a block of heat conducting material and having a splice contacting surface 34. The tape applier block is bolted to a block of insulating material 24 which is held in a yoke 22. An electrical heating element 26 is sandwiched between the tape applier block 28 and the insulating block 24 and is adapted to heat the tape applier block to a temperature sufficient to activate the heat activated splice tape. Insulating block 24 limits thermal conduction from the heating element 26 to the yoke portion 22. The temperature of the splice tape applier block 28 is monitored by a sensor 29 connected to the side of block 28. The signal from sensor 29 is used to control the cycling of heating element 26. The lead wires from heating element 26 are routed through a hole 25 in the insulating block to protect them from damage.

The lower end of the guide track 18 is provided with an opening 30 through which splice tape 20 is supplied to the area over the splice pad 21. The lower rear edge 32 of the tape applier block 28 is arranged to act as a guillotine cutter to cut off an increment of tape 19 (shown in phantom) extending out from opening 30.

The lower face 34 of tape applier block 28 is substantially flat and is arranged to press the cut increment of splice tape to the adjacent film ends and to hold it there while heat is applied to form a seal therewith. A spring loaded finger member 36 is arranged in a hole in the lower face of the tape applier block 28 and extends downwardly therefrom to engage the outer end of the splice tape before it is severed from the remaining tape supply. The finger pushes the tape into contact with the film ends and holds it there while the trailing end of the tape is severed by the lower rear edge 32 of the tape applier block 28.

Figure 2:
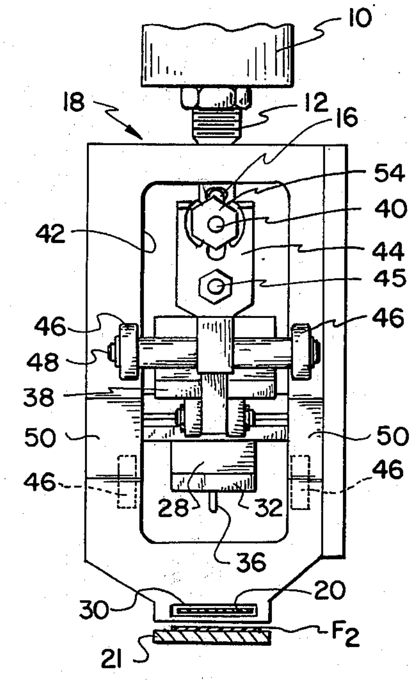
FIG. 2 is a rear view of the splice station shown in FIG. 1.

To provide a means for urging the splice head 14 into contact with the guide track 18, a bracket 38 and a post 40 are connected to the back of yoke portion 22 and extend through a slot 42 (best seen in FIG. 2) in guide track 18. A forked lever 44 is hinged at one end to bracket 38 with its forks extending around post 40. A pair of rollers 46 are supported on the ends of an axle 48 which is connected to the forked lever 44. The rollers are arranged to ride on cam surfaces 50 on the back of guide track 18.

Figure 4:
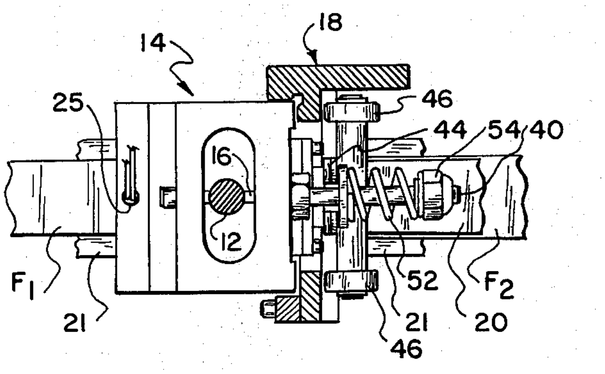
FIG. 4 is a top view of the splice station of FIG. 1 showing a section through line 4—4.
Figure 6:
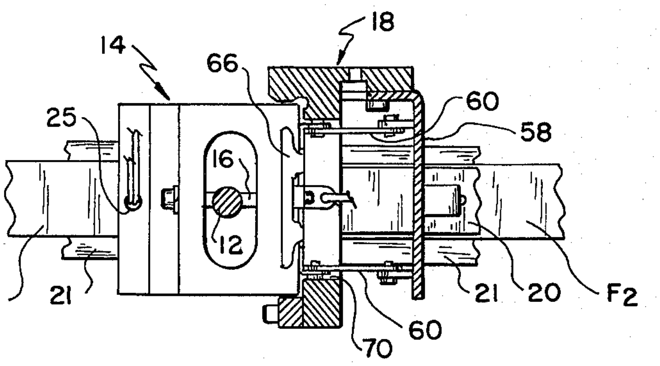
FIG. 6 is a top view with a section taken along lines 6—6 of the splice station shown in FIG. 5.

A coil spring 52 surrounding post 40 is interposed between the fork of lever 44 and a retaining nut 54. An adjustable set screw 45 is threaded through forked lever 44 and is held in place by a jam nut. When the splice head is raised, set screw 45 contacts the back of yoke 22 and holds forked lever 44 against spring 52 so that there is some clearance between wheels 48 and cam surfaces 50. This insures that spring 52 can exert no force urging the splice head toward the guide track when the splice head is raised. In this position (as shown from the top in FIG. 4) the splice head 14 is loosely coupled to guide track 18 thereby reducing the thermal conduction between the splice head and the guide track.

Figure 3:
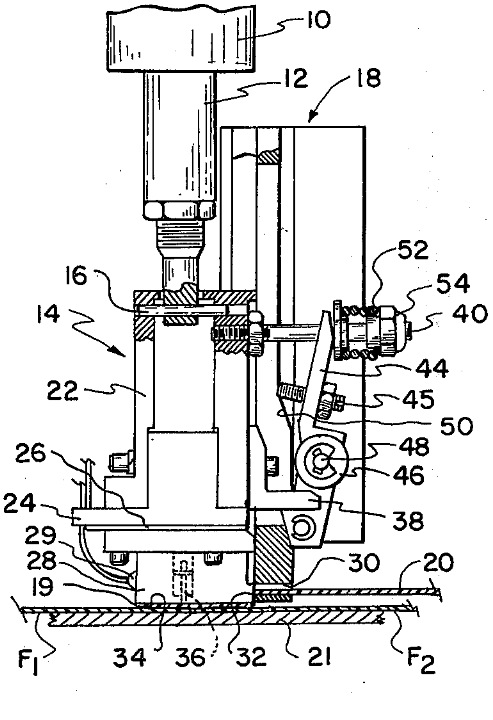
FIG. 3 is a side view of the splice station of FIG. 1 shown with the splice head in the lowered position.

As the splice head is lowered, the rollers 48 are forced away from the splice head by the cam surfaces 50 thus pivoting the forked lever 44 away from the splice head 14 and compressing the spring 52 between the ends of forked lever 44 and the retaining nut 54. As splice head 14 is lowered it is urged with increasing force against guide track 18 until, as shown in FIG. 3 the splice head has been fully lowered and spring 52 is compressed.

Thus it can be seen that when the splice head is in its raised position, it is loosely coupled to guide track 18 thereby minimizing the heat loss through conduction from the splice head to the guide track. When splice head 14 is lowered, it is urged firmly against guide track 18 for efficient cutting of the splice tape and accurate alignment of the splice head with the splice pad.

In an alternative embodiment (FIG. 5), the splice head 14 is urged towards firm contact with guide track 18 by means of a spring 56 connected under tension between a bracket 57 mounted on the splice head and an extension 58 mounted on the guide track 18. A plate 64 is interposed between the splice head and the guide track and is connected to the guide track by means of a parallelogram type linkage comprising pairs of linkage arms 60 and 62. The linkage arms are mounted for pivotal movement on tabs formed from plate 64 and extension 58. Plate 64 extends through an aperture 70 (best seen in FIG. 7) in the guide track and includes a portion 66 which is adapted to be engaged by the top rear corner 72 of the splice head. A spring 68 is connected between plate 64 and bracket 57 on the splice head.

In operation, when the splice head 14 is moved to its raised position, the extended portion 66 of plate 64 is engaged by the top rear corner 72 of the splice head 14 to raise plate 64 with the splice head. As plate 64 is raised, linkage arm pairs 60 and 62 pivot to the horizontal position shown in FIG. 5. The linkage arms are of sufficient length when in their horizontal position to push the splice head against the force of spring 56 away from contact with the guide track. In this position, there is a clearance between the splice head and the guide track as shown in FIG. 7. When the splice head is in its raised position, thermal conduction from the splice head to the guide track is limited to conduction taking place through the linkage arms 60 and 62 via plate 64 and the splice head does not heat-sink directly to the guide track.

Figure 5:
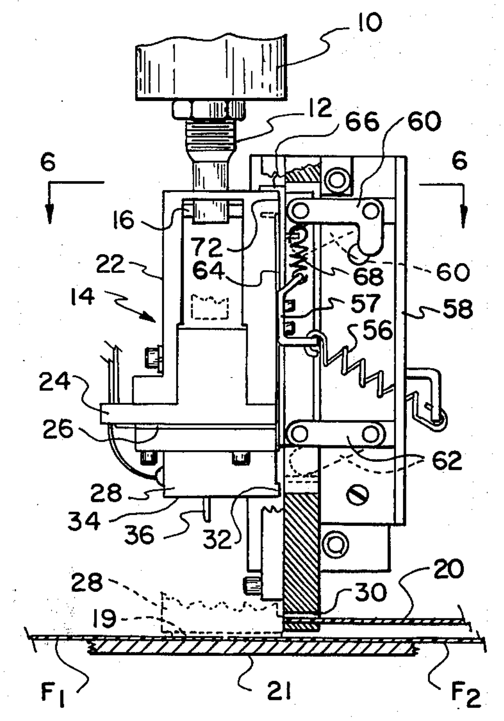
FIG. 5 is a side view of a splice station according to an alternative embodiment of the present invention.

When splice head 14 is lowered to effect a splice, plate 64 is urged downward via spring 68 pivoting the linkage arms 60 and 62 to the positions shown in phantom in FIG. 5 and withdrawing plate 64 from contact with the back of the splice head. As plate 64 moves away from the splice head, the full force of spring 56 urges the splice head into contact with the guide track to effect the cutting of splice tape 20 and to align the splice head with the splice pad 21.

The invention has been described in detail with particular reference to a preferred embodiment thereof, but it will be understood that variations and modifications can be effected within the spirit and scope of the invention.

I claim:

1. In a heat seal film splicer of the type having a splice pad with a film supporting surface, a guide track, and a splice head having a heatable splice contacting surface, the splice head being (1) movable along the guide track toward a first position where the splice head is adapted to cooperate with a portion of the guide track to sever a portion of heat activated splice tape from a tape supply and to apply heat and pressure to a film splice by pressing the splice between the film supporting surface of the splice pad and the splice contacting surface of the splice head and (2) movable toward a second position away from the first position, the improvement comprising:

means cooperating with the splice head and the guide track and (a) responsive to movement of the splice head toward the first position for urging the splice head into firm contact with the guide track to effect severance of the splice tape and to accurately align the splice head with the splice pad, and (b) responsive to movement of the splice head toward the second position for releasing the splice head from firm contact with the guide track to minimize heat loss from the splice head to the guide track.

2. The invention claimed in claim 1 wherein said cooperating means, comprises:

a cam surface on the guide track, said cam surface facing away from the splice head; and a cam follower connected to the splice head and adapted to engage said cam surface to urge the splice head into firm contact with the guide track in response to movement of the splice head toward the first position.

3. The invention claimed in claim 2 wherein said cam follower, further comprises:

a lever pivotally mounted on the splice head;

cam surface engaging means connected to said lever and adapted to engage said cam surface for pivoting said lever in response to movement of said engaging means along said cam surface; and spring means connected to the splice head and said lever for urging the splice head into firm contact with the guide track in response to pivoting of said lever.

4. The invention claimed in claim 1 wherein said coupling means, comprises:

spring means coupled to the splice head and to the guide track for urging the splice head toward the guide track; and linkage means connected to the guide track and adapted to be engaged by the splice head when the splice head moves toward the second position for moving the splice head, against the force of said spring means, away from the guide track.

* * * * *